United States Patent [19]
Hart et al.

[11] 3,935,540
[45] Jan. 27, 1976

[54] D.C. COUPLED IMPEDANCE REDUCING CIRCUIT

[75] Inventors: Gary A. Hart, Boulder, Colo.; Melvin G. Wilson, Rochester, Minn.

[73] Assignee: International Business Machines Corporation, Armonk, N.Y.

[22] Filed: Mar. 8, 1971

[21] Appl. No.: 121,912

[52] U.S. Cl.................................. 330/10; 328/145
[51] Int. Cl.² ........................................ H03F 3/38
[58] Field of Search....................... 330/10; 328/145

[56] References Cited
UNITED STATES PATENTS

| | | | |
|---|---|---|---|
| 2,877,348 | 3/1959 | Wade et al. | 328/145 |
| 3,393,380 | 7/1968 | Webb | 330/10 X |
| 3,401,357 | 9/1968 | D'asaro | 330/10 X |
| 3,437,943 | 4/1969 | Mader | 330/10 |
| 3,502,959 | 3/1970 | Stellman | 328/145 X |
| 3,530,390 | 9/1970 | Smith | 330/10 X |
| 3,626,092 | 12/1971 | Wilson | 328/145 X |

*Primary Examiner*—James B. Mullins
*Attorney, Agent, or Firm*—Donald F. Voss

[57] ABSTRACT

Small current signals (0.5 ua and less) such as the output of a photodiode are direct current coupled to a preamplifier which also passes an impedance reducing injection current to a pair of amplifiers. A voltage output proportional to the logarithm of the signal current is produced by passing the amplified current through a log producing junction of a transistor. However, to produce the logarithm function accurately, the injected or impedance reducing current is precisionally removed so that only a very minute portion (one part out of 5000) passes through the log producing junction.

14 Claims, 3 Drawing Figures

INVENTORS
GARY A. HART
MELVIN G. WILSON
BY
Donald F Voss
ATTORNEY

D.C. COUPLED IMPEDANCE REDUCING CIRCUIT

BACKGROUND OF THE INVENTION

1. Field of the Invention

This invention relates to impedance reducing circuits and more particularly to such circuits where the impedance is reduced by injecting a carrier current which is very large compared to the input current signal and then is precisely removed to facilitate obtaining a voltage output which is proportional to the logarithm of the signal current.

The invention finds particular application to video systems having relatively high frequency responses, such as in the order of 4 megahertz. The signal current is developed in response to a photodetector sensing light from a light emitting diode scanner. The signal current from such a photodetector is approximately 0.5 ua. The capacitance of the photodetector is approximately 50 picafarads. The input impedance of the circuit must be less than 1 k ohms. The input resistance into a semiconductor junction is (26 k/I) ohms, where I is the input current in microamperes. The required input resistance is obtained by superimposing a D.C. current 26 to 50 microamperes on the signal current.

In order to eliminate the effect of variations in light intensity of the light emitting diodes making up the scanner, a second photodetector monitors the light emitting diode. The signal from the second detector is D.C. coupled to a second impedance reducing circuit in the same manner as the signal from the first photodetector is coupled to the first impedance reducing circuit. The signal currents which are amplified by the impedance reducing circuits are converted to voltage outputs which are proportional to the logarithms of the signal currents. The two voltage output signals are then divided by subtracting the logarithms of the two signals. This is done by means of a differential amplifier.

In order to accurately form the logarithm function, the amount of D.C. current, not due to the signal from the photodetector, which is allowed to flow through the log producing junction must be very small in comparison with the signal. The D.C. carrier current is removed during a reset period when the light-emitting diodes are turned off by generating a take-out current proportional to the D.C. carrier current. The circuit for removing the D.C. carrier current will not respond to the signal from the photodetector. However, removal of the D.C. carrier current, i.e., the take-out current, increases very slightly during signal time and the amplifier of take-out circuit then swings sufficiently positive to reduce the take-out current below that required to satisfy the condition of minimum current amplification within the impedance reducing circuit. Although the carrier current is substantially removed, a small amount remains so that the transistor having the log producing junction will not cut off.

DESCRIPTION OF THE PRIOR ART

Prior art scanning systems such as the combination of a cathode ray tube and photomultiplier tube or the combination of photodetector arrays have had a signal output which is greater than the D.C. components, i.e., leakage current, etc. and it was not necessary to remove the D.C. components to achieve accuracy because the D.C. component was negligible compared to the signal. However, where the D.C. current such as that due to leakage of the photodetector is comparable to the signal current, it is necessary to remove the D.C. current components.

SUMMARY OF THE INVENTION

The principle object of the invention is to provide an improved impedance reducing circuit which:
a. has a high degree of accuracy;
b. provides a high frequency response;
c. enables a voltage output which is proportional to the logarithm of the signal current to be produced accurately, and
d. injects a carrier current which is very large in comparison to the input signal and then removes the carrier current with a high degree of precision.

DETAILED DESCRIPTION

Figure 1:
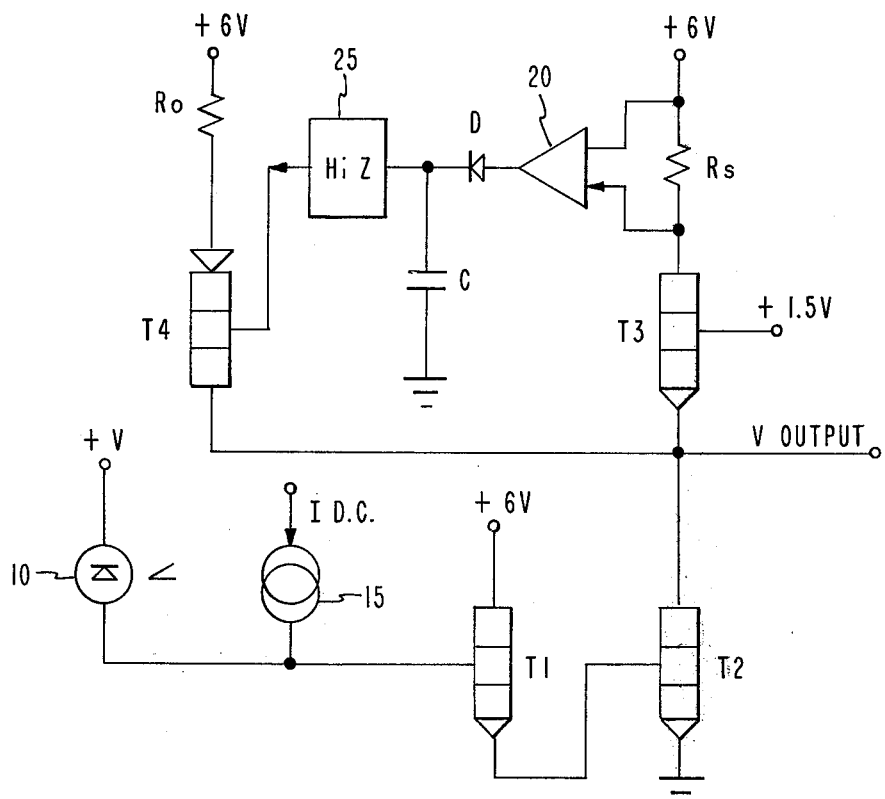
FIG. 1 is a schematic circuit diagram illustrating the invention.

In FIG. 1, the invention is illustrated by way of example wherein the input signal is generated in response to light impinging upon photodiode 10. In practice, the signal current from photodiode 10 is between 0.2 and 0.5 ua. The leakage current of photodiode 10 is on the order of 10 ua. This leakage current, as will be explained later herein, is removed along with the D.C. carrier current which is injected to reduce the input impedance. The output of photodiode 10 is D.C. coupled into the base of transistor T1. As it will be seen in FIG. 2, the output of the photodiode is actually coupled to the input of a grounded-base stage to isolate the photodiode capacitance. Also, the pre-amplifier may be A/C coupled to the photodiode to minimize the take-out current requirement. A/C coupling leads to some inaccuracy due to level shifting when the input signal is not periodic and also, tends to integrate, whereas D.C. coupling follows faithfully, and provides greater accuracy because a D.C. reference can be provided independent of the periodicity or duty cycle.

The D.C. carrier current provided by current source 15 is also applied to the base of transistor T1. Transistor T1 is connected as an emitter follower and its emitter is connected to the base of transistor T2. The emitter of transistor T2 is connected to ground potential and its collector is connected to the emitter of transistor T3.

The base emitter junction of transistor T3 produces a voltage output which is proportional to the logarithm of the signal current. Hence, the output is taken from the emitter of T3. The base of transistor T3 is connected to a positive potential so that T3 operates as a class A amplifier. The collector of T3 is connected to a positive potential via a resistor $R_s$.

As previously pointed out, the injected carrier current IDC and the D.C. components such as the leakage current of the photodiode are substantially removed so as not to pass through transistor T3. The carrier current take-out circuit includes differential amplifier 20 which has inputs connected to the +6 volt supply and the collector of transistor T3. The voltage appearing at the output of amplifier 20 which is necessary to reduce the current in T3 to nearly zero is held by a peak detecting circuit which includes diode D and capacitor C. It will be recalled that there is a period of time during which there is no signal current from photodiode 10 because the light-emitting diodes, not shown, are turned off. It is during this time that a peak level is stored on capacitor C. During this time, the collector of T3 goes negative as the D.C. current components including the carrier current start to flow through T3. Amplifier 20 is responsive and provides a voltage for charging capacitor C via diode D. The take-out current is determined by the value of resistor Ro connected in the emitter circuit of transistor T4 and the voltage at the base of T4. The base of transistor T4 is connected to the capacitor C via a high impedance circuit 25 which provides isolation to maintain the voltage on capacitor C during a relatively long signal time such as the time it takes to make one vertical scan of a character. The time constant of the peak hold action is such that the change in the take-out current through T3 is negligible between the times that there is no signal from photodiode 10.

The direction of signal current through resistor Rs is such that the unidirectional peak detector consisting of diode D and capacitor C will not respond to the signal. During signal time, the take-out current increases very slightly and the output of amplifier 20 can swing sufficiently positive to reduce the take-out current below that required to satisfy the condition of minimum current amplification through transistors T1 and T2. A small amount of the carrier current remains in transistor T3 so that it does not cut off. It will be noted that the unidirectional feature of the take-out circuit allows continual correction without the necessity of any synchronized switching signals.

Figure 2:
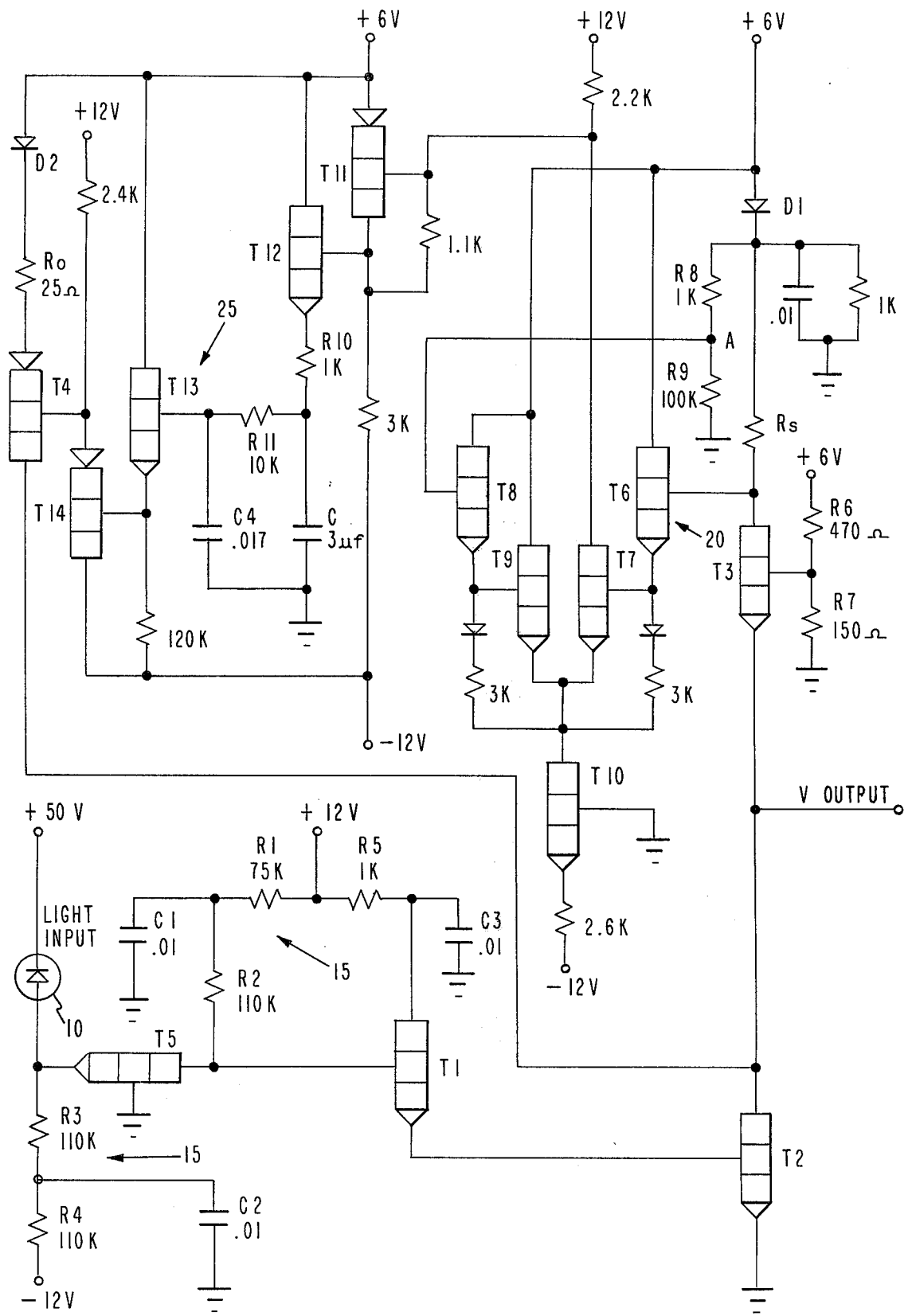
FIG. 2 is a schematic circuit diagram illustrating a preferred embodiment of the invention.

A preferred embodiment of the invention is shown in FIG. 2. The output of photodiode 10 is coupled to the emitter of a pre-amplifier transistor T5 which is connected as a grounded base stage. The pre-amplifier T5 functions as a buffer for transistor T1 to protect it against noise on the input. The D.C. carrier current flows from the +12 volt supply through resistors R1 and R2, transistor T5, resistors R3 and R4 to the −12 volt supply. Capacitors C1 and C2 filter out power supply noise. The collector of transistor T1 is connected to the +12 volt supply via resistor R5. Capacitor C3 is a filter capacitor. Transistor T1 functions in the same manner as transistor T1 of FIG. 1. The emitter of transistor T1 is connected to the base of transistor T2 which functions in the same manner as transistor T2 of FIG. 1.

A voltage divider network is connected to the base of transistor T3 and includes resistors R6 and R7. The collector of transistor T3 is connected to resistor Rs in the same manner as in FIG. 1; however, resistor Rs is connected to the +6 volt supply via a diode D1 which provides a diode voltage drop to keep the collector of T6 and T8 back biased.

Amplifier 20 includes transistors T6 and T7 connected in a Darlington configuration with the base of T6 connected to the collector of T3. Transistors T8 and T9 are also connected in a Darlington configuration with the base of T8 connected to point A. Point A is between resistors R8 and R9. At this time, it is sufficient to note that resistor R9 maintains sufficient current in transistor T3 to prevent cutoff. The emitters of transistors T7 and T9 are commonly connected to the collector of transistor T10 which functions as a current source.

The output of amplifier 20 is taken from the collector of transistor T7 and is fed into the base of transistor T11 which is connected as a feedback inverter to function as a gain stage. The collector of T11 is connected to the base of transistor T12 which is connected as an emitter follower for charging capacitor C. Transistor T12 functions as diode D in FIG. 1.

The high impedance circuit 25 of FIG. 1 consists of transistors T13 and T14 which are connected as double emitter followers. The emitter of T14 is connected to the base of transistor T4. In addition to the resistor Ro in the emitter circuit of T4, diode D2 is provided to insure the proper operating point for T4 which contributes to the high gain of the feedback circuit. The collector of T4 is connected to the collector of T2 in the same manner as in FIG. 1.

The D.C. take-out current is fed back to the collector of transistor T2 until the voltage across amplifier 20 goes to substantially zero. The voltage across resistor Rs will be slightly above zero, i.e., $$\frac{1}{100}(5.4).$$

This leaves approximately 54 ua in transistor T3 so as to prevent the same from cutting off. The amount of current left in transistor T3 can be varied as necessary by choosing the appropriate size of resistor R9.

It is thus seen that the circuit in FIG. 2 has a common base stage including transistor T5 which functions to reduce the capacitance at the first or amplification stage and in this example, by a factor of 4 to 5. This reduces the amount of carrier current into the first amplification stage including transistor T1. For example, 50 ua are injected into the common base stage and about 10 ua into T1. Thus the takeout current which is approximately the D.C. carrier current × B1,B2, is correspondingly reduced and the amplification of the takeout loop can be reduced to provide the same accuracy in the log function performed by T3. By arranging T1 and T2 in a Darlington configuration, the input resistance is approximately (52K/I) ohms. It should be noted that capacitor C4 and resistors R10 and R11 form a roll-off network to eliminate high-frequency oscillation and thereby stabilize the closed loop response of the take-out loop.

Figure 3:
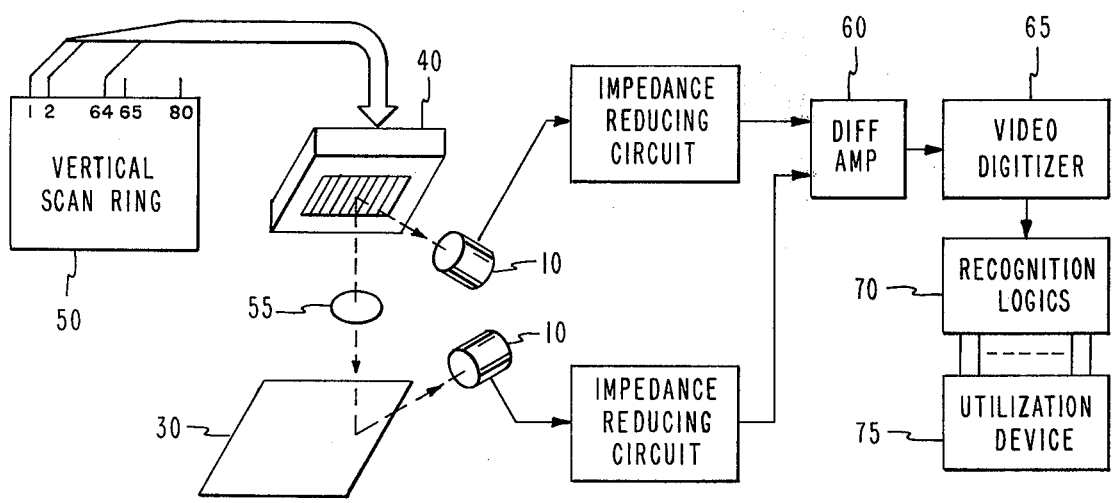
FIG. 3 illustrates the invention incorporated in a video scanner for a character recognition system.

FIG. 3 shows the invention embodied in a character recognition system. The light source for scanning document 30 consists of a linear array of light emitting diodes 40. These diodes are turned on sequentially by scan ring 50. In this example, the light emitting diode array 40 has 64 light emitting diodes. Scan ring 50 is provided with 80 positions where positions 65 through 80 provide the retrace time or the time that the light emitting diodes are all off. The light from the light emitting diodes is directed onto document 30 by lens 55. Scanning in one direction is accomplished by turning the light emitting diodes on sequentially as previously mentioned. The other direction of scan which is required to read a character or a line of characters is obtained by moving either the document 30 or the array 40.

In order to compensate for variations in the light emitting diodes, a monitoring photodiode 10 is positioned to view the light emitting diode array 40 directly. The output of this photodiode is connected to an impedance reducing circuit of the type shown in FIGS. 1 and 2. The light which is reflected from document 30 is detected by another photodiode 10 which is D.C. coupled to a second impedance reducing circuit. The outputs of the two impedance reducing circuits are connected to a differential amplifier which subtracts the logarithmic outputs of the impedance reducing circuits and thereby eliminates the effects of variations in light output of the light emitting diodes. This results in a video signal which is proportional to the reflectance of document 30.

The signal from the differential amplifier 60 is passed to a video digitizer 65. The video digitizer develops a signal at one level when light is reflected from the background area of document 30 and a signal at another level when light is reflected from a character on document 30. The digitized video signals are then passed to recognition logics 70 which develop signals for indicating the identity of the characters scanned. These recognition signals are then passed to a utilization device 75 such as a computer. This monitoring arrangement allows a variation of 50 to 70% in light emitting diode (LED) output without any detectable effect on the divided output.

We claim:
1. An impedance reducing circuit comprising:
a signal input source for perodically providing a varying signal;
semi-conductor amplifying means having an input impedance varying inversely proportional to input current and including feed forward and feed backward sections, said feed forward section having both voltage and current outputs;
means for coupling said signal input source to a semiconductor junction in said feed forward section of said amplifying means;
means for supplying a D.C. steady state current to said semi-conductor junction of said amplifying means of a magnitude at least three times greater than the peak magnitude of said varying signal to provide a constant reduction of input impedance of said amplifying means whereby within said feed forward section of said amplifying means there is an amplified signal having both varying signal and D.C. steady state current components; and
take out current generating means connected within the feed backward section of said amplifying means and responsive to the D.C. current component coming from said feed forward section of said amplifying means for generating a take out current component equal to said amplified D.C. steady state current and supplying said take out current to said feed forward section for preventing said amplified D.C. steady state current from affecting said voltage output whereby only said amplified varying signal component appears at said voltage output.

2. The impedance reducing circuit of claim 1 wherein said take out current generating means includes means for sensing said amplified D.C. current component in said feed forward section, means responsive to said sensing means for generating a take-out current equal to said D.C. steady state current, and means for applying said take-out current to said feed forward section of said amplifying means.

3. The impedance reducing circuit of claim 2 wherein a high impedance circuit is connected between said sensing means and said means for generating said take-out current.

4. The impedance reducing circuit of claim 3 wherein said high impedance circuit comprises double emitter followers.

5. The impedance reducing circuit of claim 2 wherein said sensing means comprises a resistor connected within said feed backward section of said amplifying means and a differential amplifier having inputs connected across said resistor.

6. The impedance reducing circuit of claim 5 wherein said sensing means further comprises a peak sensing circuit connected to the output of said differential amplifier.

7. The impedance reducing circuit of claim 6 wherein said peak sensing circuit periodically adjusts the value of the take-out current so that the output signal current is zero to correspond to the condition where the input signal is minimum.

8. The impedance reducing circuit of claim 6 wherein said peak sensing circuit is uni-directional.

9. The impedance reducing circuit of claim 8 wherein said peak sensing circuit comprises a diode connected to the output of said differential amplifier and a capacitor connected to said diode.

10. The impedance reducing circuit of claim 9 wherein the charge on said capacitor remains substantially the same during the time that signals are available from said signal input source.

11. The impedance reducing circuit of claim 9 wherein said capacitor charges to a peak value when said input signal is minimum.

12. The impedance reducing circuit of claim 11 wherein said charge on said capacitor provides a steady state voltage to cause said take-out current to remain substantially constant as said input signal varies from said minimum.

13. The impedance reducing circuit of claim 1 wherein said signal input source is a photodiode.

14. The impedance reducing circuit of claim 1 wherein said feed forward section of said amplifying means includes a pair of transistors connected in a Darlington configuration.

* * * * *